United States Patent
Chen et al.

(10) Patent No.: US 11,581,274 B2
(45) Date of Patent: Feb. 14, 2023

(54) SEMICONDUCTOR DEVICE PACKAGE AND METHOD OF MANUFACTURING THE SAME

(71) Applicant: Advanced Semiconductor Engineering, Inc., Kaohsiung (TW)

(72) Inventors: Jenchun Chen, Kaohsiung (TW); An-Ping Chien, Kaohsiung (TW)

(73) Assignee: ADVANCED SEMICONDUCTOR ENGINEERING, INC., Kaohsiung (TW)

( * ) Notice: Subject to any disclaimer, the term of this patent is extended or adjusted under 35 U.S.C. 154(b) by 224 days.

(21) Appl. No.: 16/907,049

(22) Filed: Jun. 19, 2020

(65) Prior Publication Data

US 2021/0398921 A1 Dec. 23, 2021

(51) Int. Cl.
| | |
|---|---|
| *H01L 23/66* | (2006.01) |
| *H01L 23/498* | (2006.01) |
| *H01L 21/48* | (2006.01) |
| *H01Q 1/38* | (2006.01) |
| *H01L 23/552* | (2006.01) |

(52) U.S. Cl.
CPC .......... *H01L 23/66* (2013.01); *H01L 21/4846* (2013.01); *H01L 23/49838* (2013.01); *H01L 23/552* (2013.01); *H01Q 1/38* (2013.01); *H01L 2223/6677* (2013.01)

(58) Field of Classification Search
CPC .................. H01L 23/60; H01L 21/4846; H01L 23/49838; H01L 23/552
See application file for complete search history.

(56) References Cited

U.S. PATENT DOCUMENTS

| 9,859,232 B1 * | 1/2018 | Chiang ............... H01L 23/3121 |
| 2018/0026342 A1 | 1/2018 | Chen et al. |

* cited by examiner

*Primary Examiner* — Jasmine J Clark
(74) *Attorney, Agent, or Firm* — Foley & Lardner LLP (57) ABSTRACT

A semiconductor device package includes a substrate and a shielding layer. The substrate has a first surface, a second surface opposite to the first surface and a first lateral surface extending between the first surface and the second surface. The substrate has an antenna pattern disposed closer to the second surface than the first surface. The shielding layer extends from the first surface toward the second surface of the substrate. The shielding layer covers a first portion of the first lateral surface adjacent to the first surface of the substrate. The shielding layer exposes a second portion of the first lateral surface adjacent to the second surface of the substrate.

20 Claims, 10 Drawing Sheets

SEMICONDUCTOR DEVICE PACKAGE AND METHOD OF MANUFACTURING THE SAME

BACKGROUND

1. Technical Field

The present disclosure relates to a semiconductor device package and a method of manufacturing the same, and more particularly to a semiconductor device package including an antenna and a method of manufacturing the same.

2. Description of the Related Art

Wireless communication devices, such as cell phones, typically include antennas for transmitting and receiving radio frequency (RF) signals. Comparably, a wireless communication device includes an antenna and a communication module, each disposed on different parts of a circuit board. Under the comparable approach, the antenna and the communication module are separately manufactured and electrically connected together after being placed on the circuit board. Accordingly, separate manufacturing costs may be incurred for both components. Furthermore, it may be difficult to reduce a size of the wireless communication device to attain a suitably compact product design. To reduce the cost and package size, an Antenna-in-Package (AiP) approach is provided. However, integrating antennas in a package may attenuate the radiation of the antennas, which would adversely affect the performance of the antennas.

SUMMARY

In accordance with some embodiments of the present disclosure, a semiconductor device package includes a substrate and a shielding layer. The substrate has a first surface, a second surface opposite to the first surface and a first lateral surface extending between the first surface and the second surface. The substrate has an antenna pattern disposed closer to the second surface than the first surface. The shielding layer extends from the first surface toward the second surface of the substrate. The shielding layer covers a first portion of the first lateral surface adjacent to the first surface of the substrate. The shielding layer exposes a second portion of the first lateral surface adjacent to the second surface of the substrate.

In accordance with some embodiments of the present disclosure, a semiconductor device package includes a substrate, a package body, an antenna pattern and a shielding layer. The substrate has a first surface, a second surface opposite to the first surface and a first lateral surface extending between the first surface and the second surface. The package body is disposed on the first surface of the substrate. The package body has a first lateral surface substantially coplanar with the first lateral surface of the substrate. The antenna pattern is disposed within the substrate and adjacent to the second surface of the substrate. The shielding layer is disposed on the first lateral surface of the package body and a portion of the first lateral surface of the substrate.

In accordance with some embodiments of the present disclosure, a method of manufacturing a semiconductor device package includes (a) providing a substrate, the substrate having a first surface, a second surface opposite to the first surface and a first lateral surface extending between the first surface and the second surface, the substrate having an antenna pattern adjacent to the second surface of the substrate; and (b) forming a shielding layer on the first lateral surface of the substrate. A distance between the second surface of the substrate and a lower surface of the shielding layer is larger than a distance between the second surface of the substrate and an upper surface of the antenna pattern.

Common reference numerals are used throughout the drawings and the detailed description to indicate the same or similar components. The present disclosure will be readily understood from the following detailed description taken in conjunction with the accompanying drawings.

DETAILED DESCRIPTION

Figure 1A:
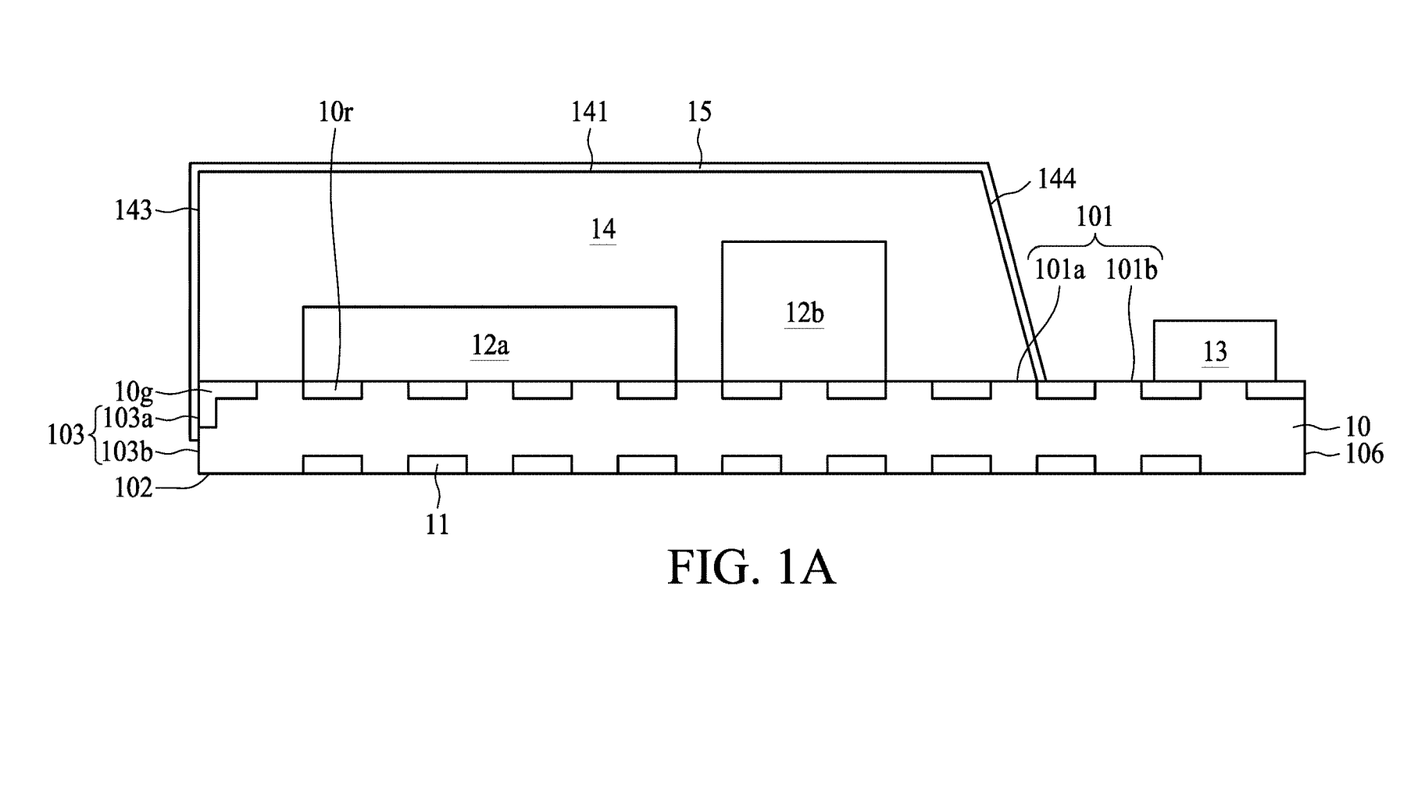
FIG. 1A illustrates a cross-sectional view of a semiconductor device package, in accordance with some embodiments of the present disclosure.
Figure 1B:
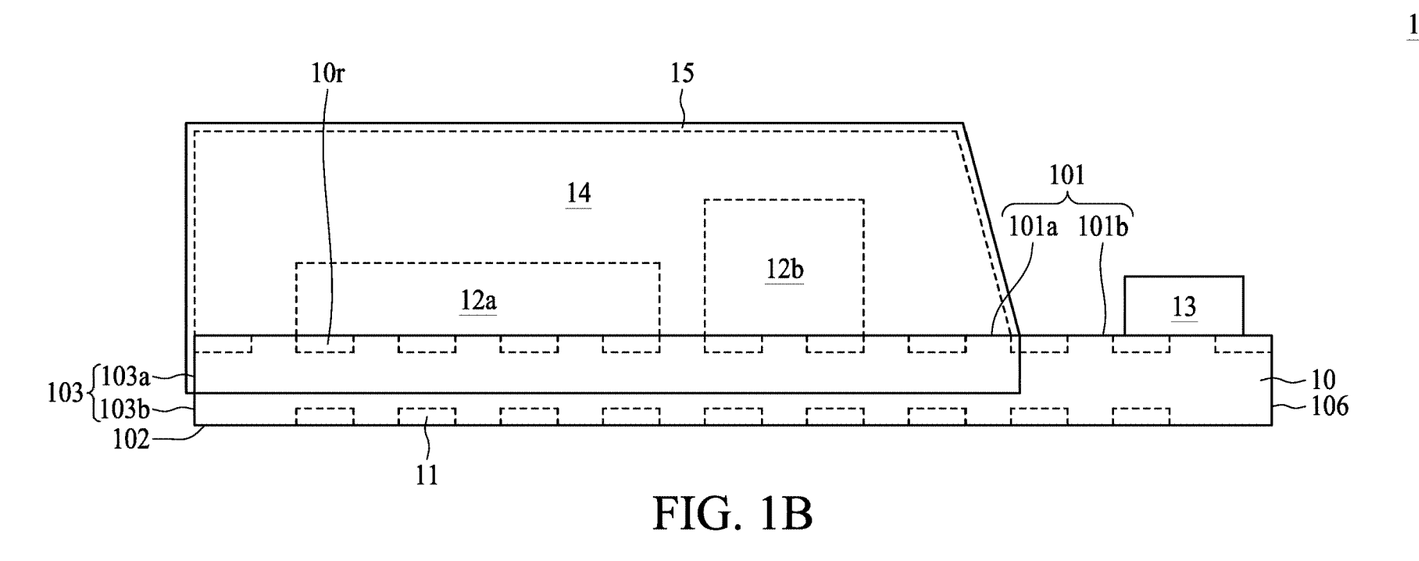
FIG. 1B illustrates a side view of the semiconductor device package as shown in FIG. 1A, in accordance with some embodiments of the present disclosure.
Figure 1C:
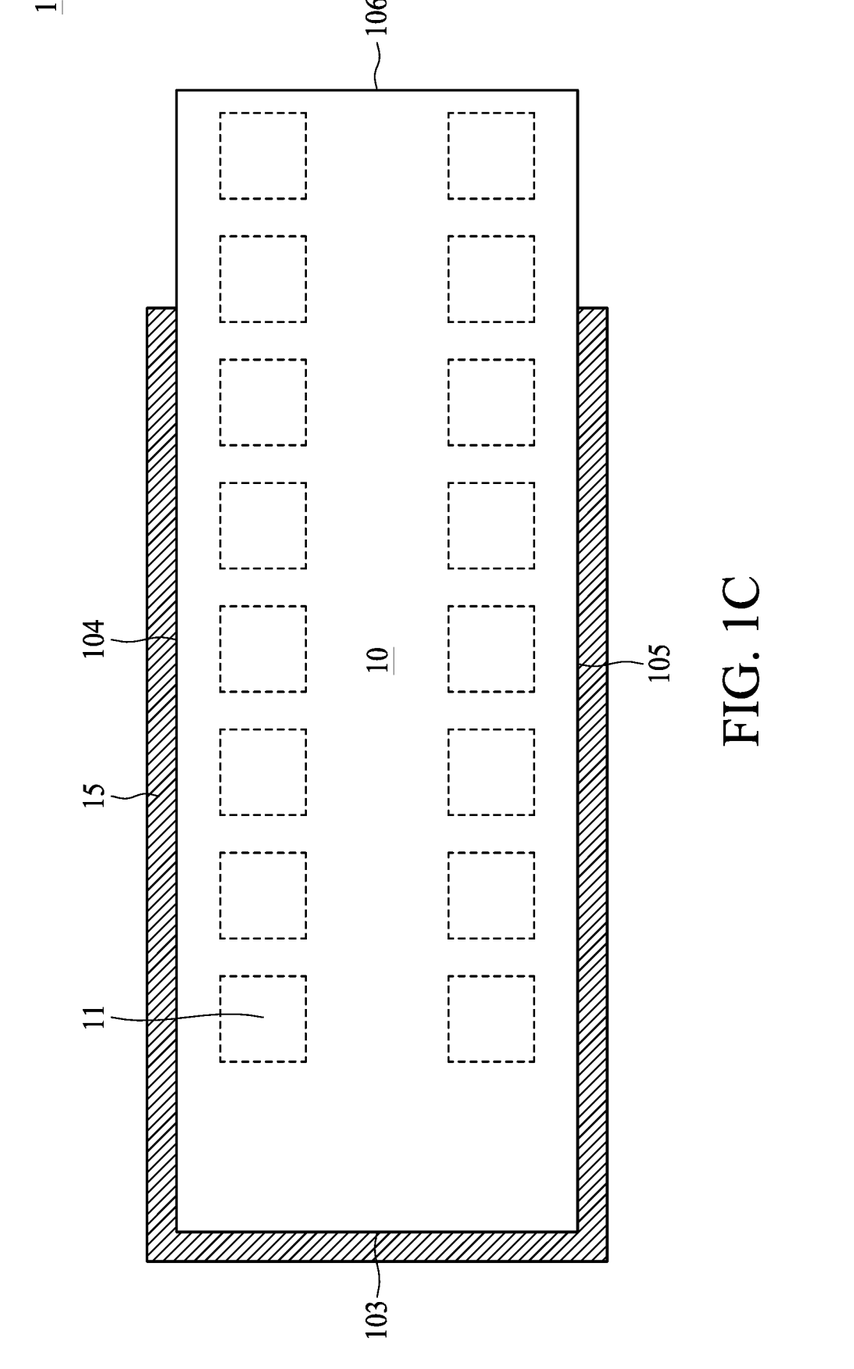
FIG. 1C illustrates a bottom view of the semiconductor device package as shown in FIG. 1A, in accordance with some embodiments of the present disclosure.

FIG. 1A illustrates a cross-sectional view of a semiconductor device package 1, in accordance with some embodiments of the present disclosure. FIG. 1B illustrates a side view of the semiconductor device package 1 as shown in FIG. 1A, in accordance with some embodiments of the present disclosure. FIG. 1C illustrates a bottom view of the semiconductor device package 1 as shown in FIG. 1A, in accordance with some embodiments of the present disclosure. The semiconductor device package 1 includes a substrate 10, an antenna pattern, electronic components 12a, 12b, a connector 13, a package body 14 and a shielding layer 15.

The substrate 10 may be, for example, a printed circuit board, such as a paper-based copper foil laminate, a composite copper foil laminate, or a polymer-impregnated glass-fiber-based copper foil laminate. The substrate 10 may include an interconnection structure 10r, such as a redistribution layer (RDL) or a grounding element 10g. In some embodiments, the substrate 10 may be a single-layer substrate or multi-layer substrate. The substrate 10 has a surface 101 (also can be referred to as a first surface) and a surface 102 (also can be referred to as a second surface) opposite to the surface 101. The substrate 10 has a lateral surface 103 extending between the surface 101 and the surface 102.

The substrate 10 may include a conductive layer 11 disposed adjacent to the surface 102 of the substrate 10. For example, the conductive layer 11 is closer to the surface 102 of the substrate 10 than the surface 101 of the substrate 10. In some embodiments, the conductive layer 11 may be fully embedded or disposed within the substrate 10. In some embodiments, a portion of the conductive layer 11 (e.g., a lower surface of the conductive layer 11) may be exposed from the surface 102 of the substrate 10.

In some embodiments, the conductive layer 11 defines a patterned antenna, such as a directional antenna, an omnidirectional antenna, an antenna array. For example, conductive layer 11 can be also referred to as an antenna pattern or an antenna layer. In some embodiments, as shown in FIG. 1C, the conductive layer 11 may have a plurality of antennas defining an antenna array. In some embodiments, the conductive layer 11 may include any number of antennas depending on different design requirements. The conductive layer 11 is, or includes, a conductive material such as a metal or metal alloy. Examples of the conductive material include gold (Au), silver (Ag), copper (Cu), platinum (Pt), Palladium (Pd), other metal(s) or alloy(s), or a combination of two or more thereof.

The electrical components 12a, 12b are disposed on the surface 101 of the substrate 10. The electrical component 12a may be an active component, such as an integrated circuit (IC) chip or a die. The electrical component 12b may be a passive electrical component, such as a capacitor, a resistor or an inductor. Each electrical component 12a, 12b may be electrically connected to one or more of another electrical component 12a, 12b and to the substrate 10 (e.g., to the interconnection structure 10r), and electrical connection may be attained by way of flip-chip or wire-bond techniques.

The connector 13 is disposed on the surface 101 of the substrate 10. The connector 13 is electrically connected to the substrate 10 (e.g., to the interconnection structure 10r). The connector 13 may be electrically connected to the electronic components 12a and/or 12b through the interconnection structure 10r of the substrate 10. In some embodiments, the connector 13 may provide electrical connections between the semiconductor device package 1 and external devices or a circuit board.

The package body 14 is disposed on the surface 101 of the substrate 10. The package body 14 covers a portion 101a of the surface 101 of the substrate 10 and exposes another portion 101b of the surface 101 of the substrate 10. The package body 14 covers or encapsulates the electronic components 12a, 12b. The package body 14 exposes the connector 13. The package body 14 includes a lateral surface 143 substantially coplanar with the lateral surface 103 of the substrate 10. The package body 14 includes a lateral surface 144 opposite to the lateral surface 143. In some embodiments, the lateral surface 143 is inclined from a surface 141 of the package body 14 to the surface 101 of the substrate 10. For example, the lateral surface 144 of the package body 14 is not perpendicular to the surface 101 of the substrate 10. For example, the lateral surface 144 and the surface 101 of the substrate 10 define an angle less than 90 degrees. In some embodiments, the package body 14 includes an epoxy resin having fillers, a molding compound (e.g., an epoxy molding compound or other molding compound), a polyimide, a phenolic compound or material, a material with a silicone dispersed therein, or a combination thereof.

The shielding layer 15 is disposed on external surfaces of the package body 14 and covers the package body 14. For example, the shielding layer 15 covers the surface 141 and the lateral surfaces 143, 144 of the package body 14. The shielding layer 15 covers the electronic components 12a, 12b to prevent the electronic components 12a, 12b from being interfered by electromagnetic wave (e.g., electromagnetic interference, EMI) from other electronic components, and vice versa.

As shown in FIG. 1A and FIG. 1B, the shielding layer 15 further covers a portion 103a of the lateral surface 103 of the substrate 10 and exposes another portion 103b of the lateral surface 103 of the substrate 10. For example, the shielding layer 15 may extend from the surface 141 of the package body 14 toward the substrate 10. The shielding layer 15 is electrically connected to the grounding element 10g of the substrate 10.

As shown in FIG. 1A and FIG. 1B, the shielding layer 15 and the interconnection structure 10r of the substrate 10 may be fully overlapping in a direction substantially perpendicular to the surface 101 of the substrate 10. For example, an altitude of a lower surface of the shielding layer 15 is lower than an altitude of a lower surface of the interconnection structure 10r. For example, a distance between the lower surface of the shielding layer 15 and the surface 102 of the substrate 10 is less than a distance between the lower surface of the interconnection structure 10r and the surface 102 of the substrate 10. Hence, the shielding layer 15 can provide a better shielding capability for the interconnection structure 10r of the substrate 10.

In some embodiments, the shielding layer 15 and the conductive layer 11 may not be overlapping in a direction substantially perpendicular to the surface 101 of the substrate 10. For example, an altitude of the lower surface of the shielding layer 15 is higher than an altitude of an upper surface of the conductive layer 11. For example, a distance between the lower surface of the shielding layer 15 and the surface 102 of the substrate 10 is greater than a distance between the upper surface of conductive layer 11 and the surface 102 of the substrate 10.

In some embodiments, the shielding layer 15 may fully cover the lateral surface 103 of the substrate 10. For example, the shielding layer 15 covers the conductive layer 11 (e.g., antenna pattern) in a direction substantially perpendicular to the surface 101 of the substrate 10. Hence, parts of the electromagnetic wave radiated from the conductive layer 11 are blocked by the shielding layer 15, which would adversely affect the performance of the conductive layer 11. In addition, when a test operation is carried out for the semiconductor device package having the shielding layer 15 fully covering the lateral surface 103 of the substrate 10, a socket is in contact with the shielding layer 15 to hold the semiconductor device package 1. The socket may scratch the shielding layer 15, which would adversely affect the shielding capability of the shielding layer 15.

In accordance with the embodiments as shown in FIG. 1A, the shielding layer 15 exposes the conductive layer 11 in a direction substantially perpendicular to the surface 101 of the substrate 10, and thus the shielding layer 15 would not block the electromagnetic wave radiated from the conductive layer 11 in the direction substantially perpendicular to the surface 101 of the substrate 10. This can improve the performance of the conductive layer 11. In addition, when a test operation is carried out for the semiconductor device package 1 having the shielding layer 15 partially covering the lateral surface 103 of the substrate 10, a socket can be in contact with the portion 103b of the lateral surface 103 of the substrate 10 to hold the semiconductor device package 1 without contacting the shielding layer 15. This can prevent the shielding layer 15 from being scratched or damaged by the socket.

As shown in FIG. 1C, the shielding layer 15 covers a portion of each of the lateral surfaces 103, 104 and 105 of the substrate 10. The shielding layer 15 fully exposes the lateral surface 106 of the substrate 10 opposite to the lateral surface 103 of the substrate 10.

In some embodiments, the shielding layer 15 is a conductive thin film, and may include, for example, aluminum (Al), copper (Cu), chromium (Cr), tin (Sn), gold (Au), silver (Ag), nickel (Ni) or stainless steel, or a mixture, an alloy, or other combination thereof. The shielding layer 15 may include a single conductive layer or multiple conductive layers.

Figure 2A:
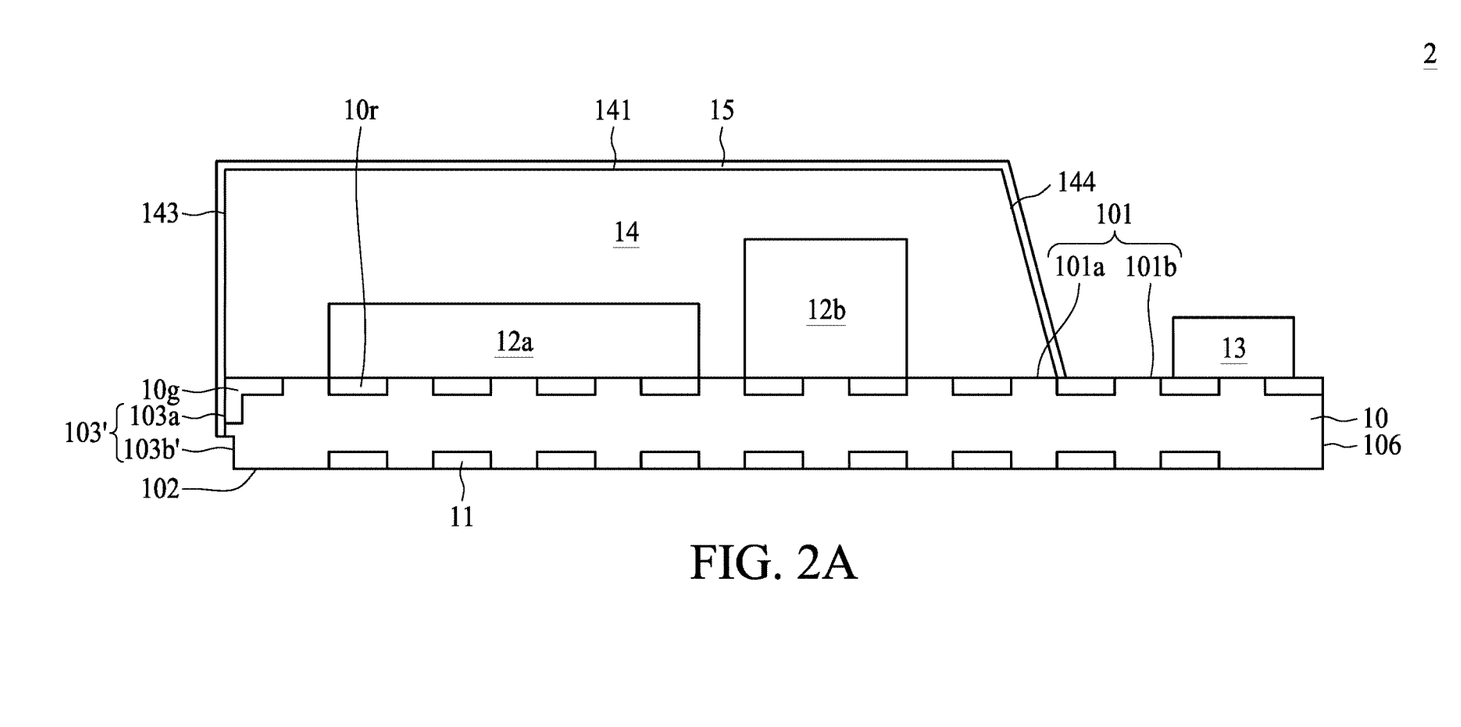
FIG. 2A illustrates a cross-sectional view of a semiconductor device package, in accordance with some embodiments of the present disclosure.
Figure 2B:
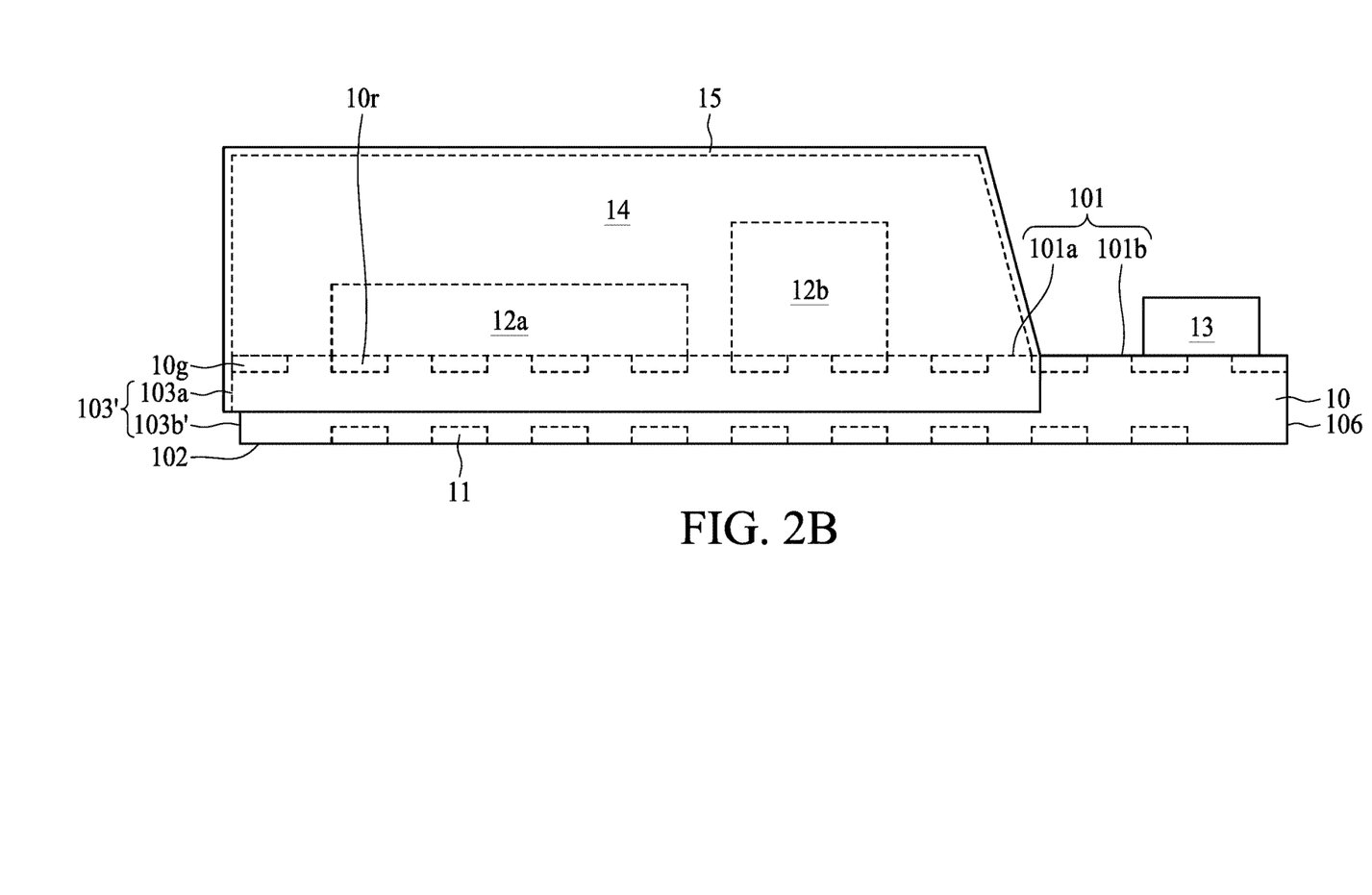
FIG. 2B illustrates a side view of the semiconductor device package as shown in FIG. 2A, in accordance with some embodiments of the present disclosure.
Figure 2C:
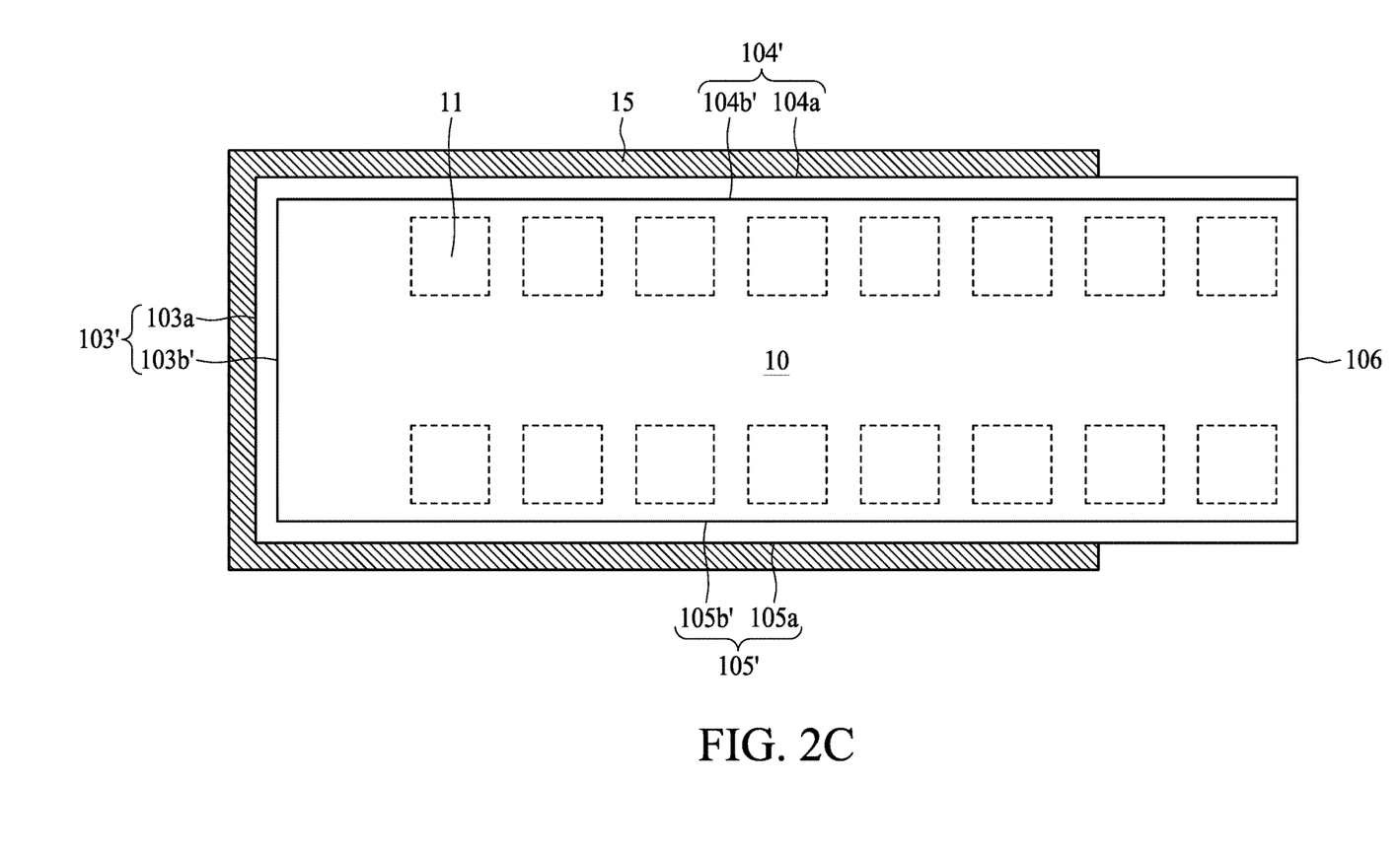
FIG. 2C illustrates a bottom view of the semiconductor device package as shown in FIG. 2A, in accordance with some embodiments of the present disclosure.

FIG. 2A illustrates a cross-sectional view of a semiconductor device package 2, in accordance with some embodiments of the present disclosure. FIG. 2B illustrates a side view of the semiconductor device package 2 as shown in FIG. 2A, in accordance with some embodiments of the present disclosure. FIG. 2C illustrates a bottom view of the semiconductor device package 2 as shown in FIG. 2A, in accordance with some embodiments of the present disclosure. The semiconductor device package 2 is similar to the semiconductor device package 1, and some of the differences therebetween are described below.

As shown in FIG. 2A, FIG. 2B and FIG. 2C, the lateral surface 103' of the substrate 10 includes a portion 103a covered by the shielding layer 15 and another portion 103b' exposed from the shielding layer 15. The portion 103a and the portion 103b' of the lateral surface 103' of the substrate 10 are noncoplanar to each other. For example, the portion 103a and the portion 103b' of the lateral surface 103' of the substrate 10 are discontinuous. The portion 103b' of the lateral surface 103' of the substrate 10 is recessed from the portion 103a of the lateral surface 103' of the substrate 10. For example, the portion 103a and the portion 103b' of the lateral surface 103' of the substrate 10 define a step (or a ladder) structure. In some embodiments, a roughness of the portion 103a of the lateral surface 103' is different from a roughness of the portion 103b' of the lateral surface 103'. For example, the roughness of the portion 103a of the lateral surface 103' is less than the roughness of the portion 103b' of the lateral surface 103'.

Similarly, as shown in FIG. 2C, the lateral surface 104' of the substrate 10 includes a portion 104a covered by the shielding layer 15 and another portion 104b' exposed from the shielding layer 15. The portion 104b' of the lateral surface 104' of the substrate 10 is recessed from the portion 104a of the lateral surface 104' of the substrate 10. The lateral surface 105' of the substrate 10 includes a portion 105a covered by the shielding layer 15 and another portion 105b' exposed from the shielding layer 15. The portion 105b' of the lateral surface 105' of the substrate 10 is recessed from the portion 105a of the lateral surface 105' of the substrate 10.

In some embodiments, a roughness of the portion 104b' of the lateral surface 104' of the substrate 10 is different from a roughness of the portion 104a of the lateral surface 104' of the substrate 10. For example, the roughness of the portion 104b' of the lateral surface 104' of the substrate 10 is greater than the roughness of the portion 104a of the lateral surface 104' of the substrate 10.

In some embodiments, a grinding operation may be carried out on the portion 103b' of the lateral surface 103' of the substrate 10 and the portion 104b' of the lateral surface 104' of the substrate 10 to reduce the roughness thereof. This would mitigate the adverse influence on the radiation of the antenna and increase the directional gain of the antenna. In some embodiments, the grinding operation may include a coarse grinding operation (e.g., 500-800 mesh/inch), a fine grinding operation (e.g., 3000-5000 mesh/inch), and a finer grinding operation (e.g., more than 6000 mesh/inch). For example, the coarse grinding operation, the fine grinding operation and the finer grinding operation may be carried out on the portion 103b' of the lateral surface 103' of the substrate 10 and the portion 104b' of the lateral surface 104' of the substrate 10 in order. In some embodiments, after the grinding operation, the portion 103b' of the lateral surface 103' of the substrate 10 and the portion 104b' of the lateral surface 104' of the substrate 10 may be substantially the same as or similar to the portion 103a of the lateral surface 103' of the substrate 10 and the portion 104a of the lateral surface 104' of the substrate 10. In other embodiments, after the grinding operation, the portion 103b' of the lateral surface 103' of the substrate 10 and the portion 104b' of the lateral surface 104' of the substrate 10 may be less than the portion 103a of the lateral surface 103' of the substrate 10 and the portion 104a of the lateral surface 104' of the substrate 10 respectively.

Figure 3A:
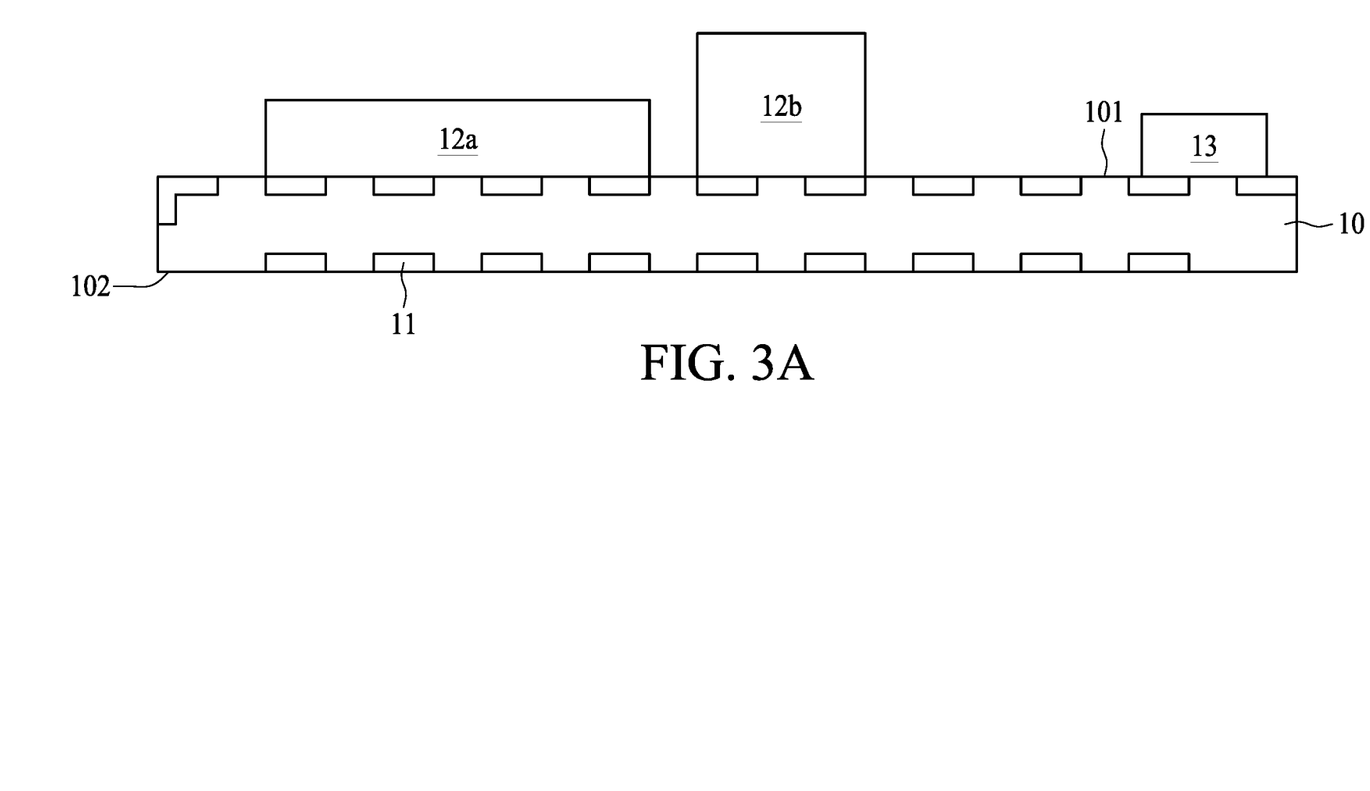
FIG. 3A, FIG. 3B and FIG. 3C illustrate a semiconductor manufacturing method in accordance with some embodiments of the present disclosure.
Figure 3B:
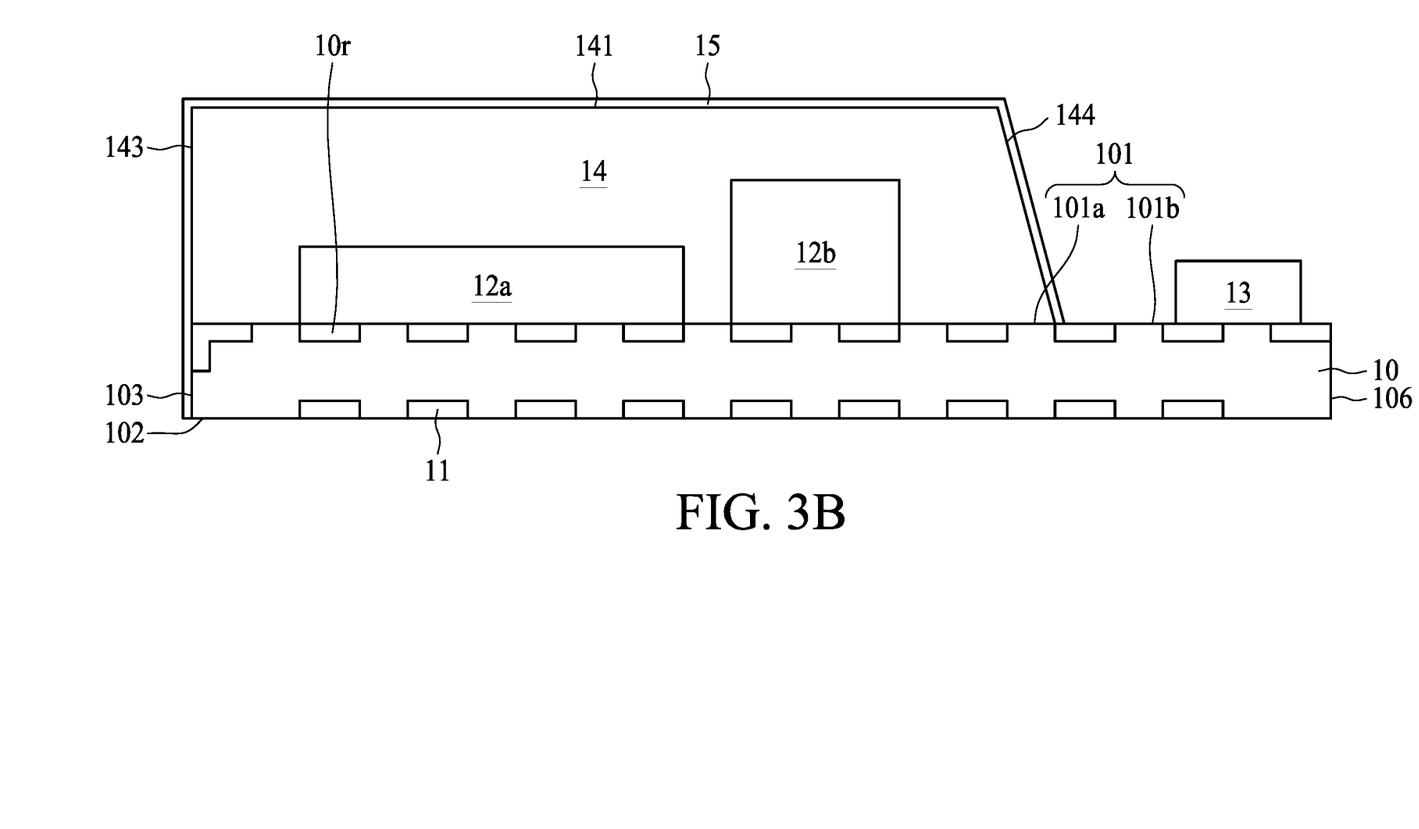
Figure 3C:
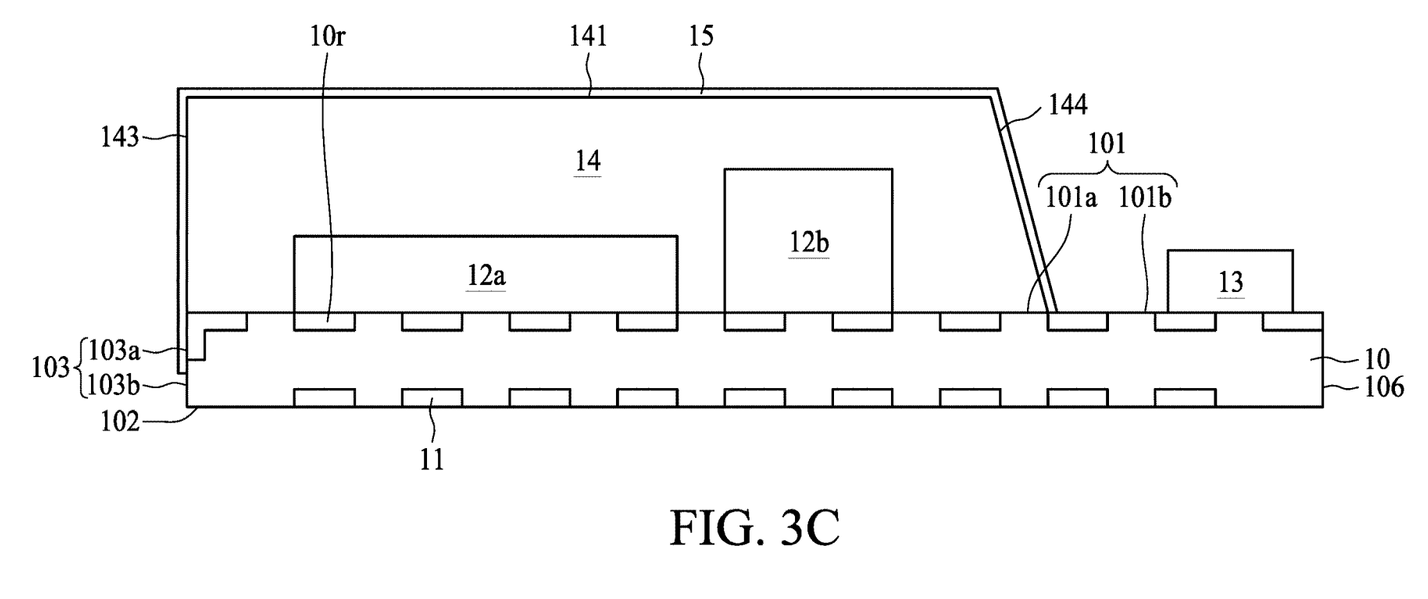

FIG. 3A, FIG. 3B and FIG. 3C illustrate a semiconductor manufacturing method in accordance with some embodiments of the present disclosure. In some embodiments, the method in FIG. 3A, FIG. 3B and FIG. 3C can be used to manufacture the semiconductor device package 1 in FIG. 1A, FIG. 1B and FIG. 1C or the semiconductor device package 2 in FIG. 2A, FIG. 2B and FIG. 2C.

Referring to FIG. 3A, a substrate 10 is provided. The substrate 10 may have a conductive layer 11 (e.g., an antenna pattern) disposed adjacent to its surface 102. In some embodiments, a baking operation may be carried out to the substrate 10.

Electronic components 12a, 12b and a connector 13 are disposed on a surface 101 of the substrate 10. In some embodiments, the electronic components 12a, 12b and the connector 13 are be disposed on the surface 101 of the substrate 10 by, for example, surface mount technology (SMT) or any other suitable techniques.

Referring to FIG. 3B, a package body 14 is formed on a portion 101a of the surface 101 of the substrate 10. The package body 14 exposes another portion 101b of the surface 101 of the substrate 10. The package body 14 covers or encapsulates the electronic components 12a, 12b. The package body 14 exposes the connector 13. In some embodiments, the package body 14 may be formed by, for example, selective molding or any other suitable processes.

A shielding layer 15 is formed on external surfaces of the package body 14 and covers the package body 14. For example, the shielding layer 15 covers the surface 141 and the lateral surfaces 143, 144 of the package body 14. The shielding layer 15 also fully covers the lateral surface 103 of the substrate 10. In some embodiments, the shielding layer 15 may be formed by, for example, sputtering, coating or any other suitable processes.

In some embodiments, prior to the formation of the shielding layer 15, a protection layer may be disposed to cover the connector 13 to prevent the shielding layer 15 to form on the connector 13 and the lateral surface 106 of the substrate 10. The protection layer is then removed to expose the connector 13 and the lateral surface 106 of the substrate 10 after the formation of the shielding layer 15.

Referring to FIG. 3C, a portion of the shielding layer 15 is removed to expose a portion 103b of the lateral surface 103 of the substrate 10 while another portion 103a of the lateral surface 103 of the substrate 10 remains covered by the shielding layer 15 to form the semiconductor device package 1 as shown in FIG. 1A. In some embodiments, the portion of the shielding layer 15 may be removed by, for example, scratching, grinding, laser, etching or any other suitable processes.

In some embodiments, during the removal operation of the shielding layer 15, a portion of the lateral surface 103 of the substrate 10 would be removed as well to form the semiconductor device package 2 as shown in FIG. 2A.

Figure 4:
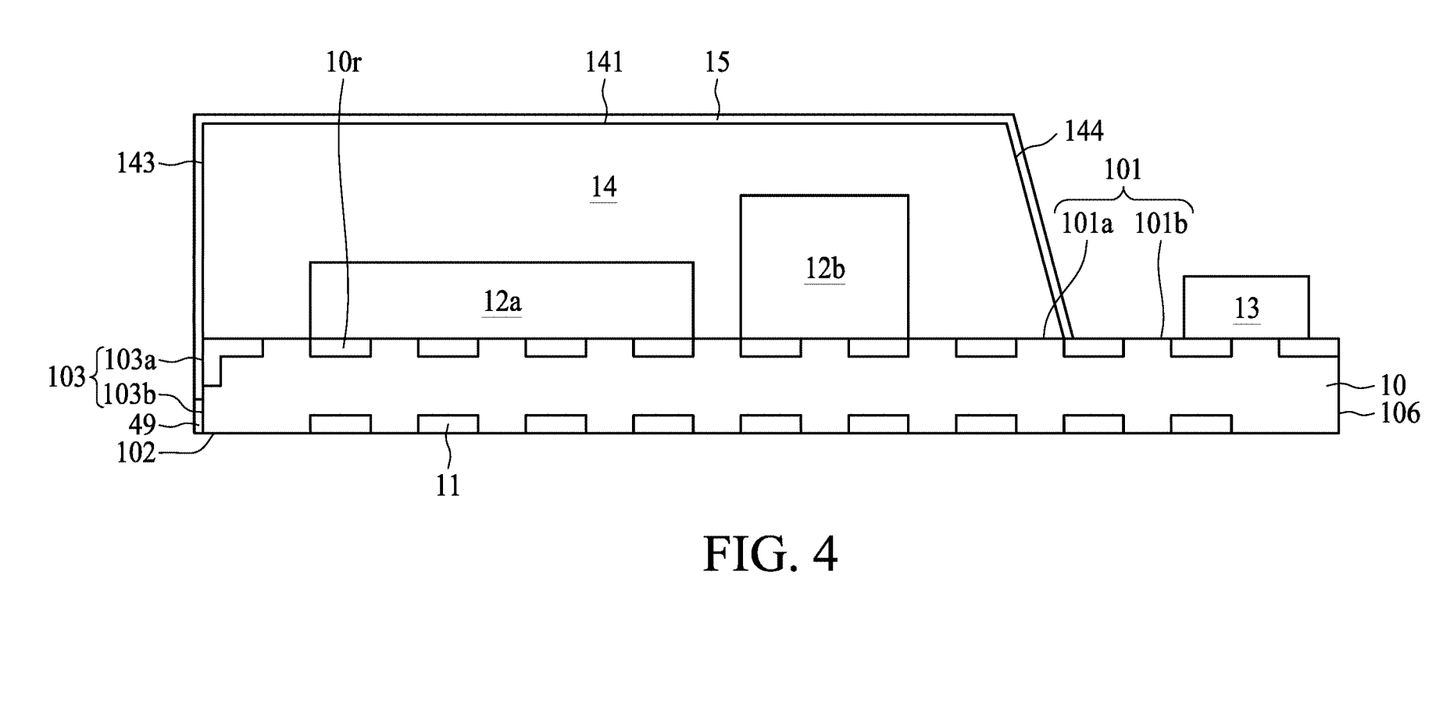
FIG. 4 illustrates a semiconductor manufacturing method in accordance with some embodiments of the present disclosure.

FIG. 4 illustrates a semiconductor manufacturing method in accordance with some embodiments of the present disclosure. In some embodiments, the method in 4 can be used to manufacture the semiconductor device package 1 in FIG. 1A, FIG. 1B and FIG. 1C. In some embodiments, the operations as illustrated in FIG. 4 may be carried out after the formation of the package body 14 (or prior to the formation of the shielding layer 15) as illustrated in FIG. 3B.

Referring to FIG. 4, a protection film 49 (e.g., glue, a tape or the like) is disposed on the portion 103b of the lateral surface 103 of the substrate 10. The shielding layer 15 is then formed on external surfaces of the package body 14 and the portion 103a of the lateral surface 103 of the substrate 10. In some embodiments, the shielding layer 15 may be formed by, for example, sputtering, coating or any other suitable processes.

After the formation of the shielding layer 15, the semiconductor device package 1 as shown in FIG. 1A can be formed by removing the protection film 49 from the portion 103b of the lateral surface 103 of the substrate 10 to expose the portion 103b of the lateral surface 103 of the substrate 10.

In other embodiments, prior to the operations as illustrated in FIG. 3A, the substrate 10 may be disposed on a carrier having an adhesive layer thereon. A portion of the substrate 10 may sink into the adhesive layer. For example, the adhesive layer may cover the portion 103b of the lateral surface 103 of the substrate 10. The carrier along with the adhesive layer is then removed after the formation of the shielding layer 15 to expose the portion 103b of the lateral surface 103 of the substrate 10.

As used herein, the terms "substantially," "substantial," "approximately," and "about" are used to denote and account for small variations. For example, when used in conjunction with a numerical value, the terms can refer to a range of variation of less than or equal to ±10% of that numerical value, such as less than or equal to ±5%, less than or equal to ±4%, less than or equal to ±3%, less than or equal to ±2%, less than or equal to ±1%, less than or equal to ±0.5%, less than or equal to ±0.1%, or less than or equal to ±0.05%. As another example, a thickness of a film or a layer being "substantially uniform" can refer to a standard deviation of less than or equal to ±10% of an average thickness of the film or the layer, such as less than or equal to ±5%, less than or equal to ±4%, less than or equal to ±3%, less than or equal to ±2%, less than or equal to ±1%, less than or equal to ±0.5%, less than or equal to ±0.1%, or less than or equal to ±0.05%. The term "substantially coplanar" can refer to two surfaces within micrometers of lying along a same plane, such as within 40 within 30 within 20 within 10 or within 1 μm of lying along the same plane. Two surfaces or components can be deemed to be "substantially perpendicular" if an angle therebetween is, for example, 90°±10°, such as ±5°, ±4°, ±3°, ±2°, ±1°, ±0.5°, ±0.1°, or ±0.05°. When used in conjunction with an event or circumstance, the terms "substantially," "substantial," "approximately," and "about" can refer to instances in which the event or circumstance occurs precisely, as well as instances in which the event or circumstance occurs to a close approximation.

As used herein, the singular terms "a," "an," and "the" may include plural referents unless the context clearly dictates otherwise. In the description of some embodiments, a component provided "on" or "over" another component can encompass cases where the former component is directly on (e.g., in physical contact with) the latter component, as well as cases where one or more intervening components are located between the former component and the latter component.

As used herein, the terms "conductive," "electrically conductive" and "electrical conductivity" refer to an ability to transport an electric current. Electrically conductive materials typically indicate those materials that exhibit little or no opposition to the flow of an electric current. One measure of electrical conductivity is Siemens per meter (S/m). Typically, an electrically conductive material is one having a conductivity greater than approximately $10^4$ S/m, such as at least $10^5$ S/m or at least $10^6$ S/m. The electrical conductivity of a material can sometimes vary with temperature. Unless otherwise specified, the electrical conductivity of a material is measured at room temperature.

Additionally, amounts, ratios, and other numerical values are sometimes presented herein in a range format. It can be understood that such range formats are used for convenience and brevity, and should be understood flexibly to include not only numerical values explicitly specified as limits of a range, but also all individual numerical values or sub-ranges encompassed within that range as if each numerical value and sub-range is explicitly specified.

While the present disclosure has been described and illustrated with reference to specific embodiments thereof, these descriptions and illustrations do not limit the present disclosure. It can be clearly understood by those skilled in the art that various changes may be made, and equivalent elements may be substituted within the embodiments without departing from the true spirit and scope of the present disclosure as defined by the appended claims. The illustrations may not necessarily be drawn to scale. There may be distinctions between the artistic renditions in the present disclosure and the actual apparatus, due to variables in manufacturing processes and such. There may be other embodiments of the present disclosure which are not specifically illustrated. The specification and drawings are to be regarded as illustrative rather than restrictive. Modifications may be made to adapt a particular situation, material, composition of matter, method, or process to the objective, spirit and scope of the present disclosure. All such modifications are intended to be within the scope of the claims appended hereto. While the methods disclosed herein have been described with reference to particular operations performed in a particular order, it can be understood that these operations may be combined, sub-divided, or re-ordered to form an equivalent method without departing from the teachings of the present disclosure. Therefore, unless specifically indicated herein, the order and grouping of the operations are not limitations of the present disclosure.

What is claimed is:

1. A semiconductor device package, comprising:
 a substrate having:
  a first surface;
  a second surface opposite to the first surface;
  a first lateral surface extending between the first surface and the second surface; and
  an antenna pattern disposed closer to the second surface than to the first surface; and
 a shielding layer extending from the first surface toward the second surface of the substrate, the shielding layer covering a first portion of the first lateral surface adjacent to the first surface of the substrate and exposing a second portion of the first lateral surface adjacent to the second surface of the substrate.

2. The semiconductor device package of claim 1, wherein a bottom end of the shielding layer is farther from the second surface than a top end of the antenna pattern is.

3. The semiconductor device package of claim 1, wherein an extended line of the first surface of the substrate passes through the shielding layer.

4. The semiconductor device package of claim 1, further comprising:
an electronic component disposed on the first surface of the substrate; and
a package body disposed on the first surface of the substrate and covering the electronic component,
wherein the shielding layer is disposed on external surfaces of the package body.

5. The semiconductor device package of claim 4, wherein the package body is disposed on a first portion of the first surface of the substrate, and the package body leaves a second portion of the first surface of the substrate exposed.

6. The semiconductor device package of claim 1, wherein an altitude of a lower surface of the shielding layer is higher than an altitude of an upper surface of the antenna pattern.

7. The semiconductor device package of claim 1, wherein the second portion of the first lateral surface of the substrate is recessed from the first portion of the first lateral surface of the substrate.

8. The semiconductor device package of claim 7, wherein a roughness of the second portion of the first lateral surface of the substrate is greater than a roughness of the first portion of the first lateral surface of the substrate.

9. The semiconductor device package of claim 1, wherein
the substrate further comprises a second lateral surface adjacent to the first lateral surface, a third lateral surface opposite to the second lateral surface, and a fourth lateral surface opposite to the first lateral surface;
the shielding layer covers a portion the second lateral surface and the third lateral surface of the substrate; and
the shielding layer leaves the fourth lateral surface of the substrate fully exposed.

10. The semiconductor device package of claim 9, wherein a roughness of the second portion of the first lateral surface of the substrate is greater than a roughness of the fourth lateral surface of the substrate.

11. A semiconductor device package, comprising:
a substrate having a first surface, a second surface opposite to the first surface and a first lateral surface extending between the first surface and the second surface;
a package body disposed on the first surface of the substrate, the package body having a first lateral surface substantially coplanar with the first lateral surface of the substrate;
an antenna pattern disposed within the substrate and adjacent to the second surface of the substrate; and
a shielding layer disposed on the first lateral surface of the package body and a first portion of the first lateral surface of the substrate.

12. The semiconductor device package of claim 11, wherein an altitude of a lower surface of the shielding layer is higher than an altitude of an upper surface of the antenna pattern.

13. The semiconductor device package of claim 11, wherein the shielding layer leaves a second portion of the first lateral surface of the substrate exposed, and the second portion of the first lateral surface of the substrate is recessed from the first portion of the first lateral surface of the substrate covered by the shielding layer.

14. The semiconductor device package of claim 13, wherein a roughness of the second portion of the first lateral surface of the substrate exposed by the shielding layer is greater than a roughness of the first portion of the first lateral surface of the substrate covered by the shielding layer.

15. The semiconductor device package of claim 11, wherein
the substrate further comprises a second lateral surface adjacent to the first lateral surface, a third lateral surface opposite to the second lateral surface, and a fourth lateral surface opposite to the first lateral surface;
the shielding layer covers a portion of the second lateral surface and a portion of the third lateral surface of the substrate; and
the shielding layer leaves the fourth lateral surface of the substrate fully exposed.

16. The semiconductor device package of claim 11, wherein the package body is disposed on a first portion of the first surface of the substrate, and the package body leaves a second portion of the first surface of the substrate exposed.

17. The semiconductor device package of claim 16, further comprising:
a connector disposed on the second portion of the first surface of the substrate; and
an electronic component covered by the package body, wherein the electronic component electrically connects to the connector.

18. A method of manufacturing a semiconductor device package, comprising:
(a) providing a substrate, the substrate having a first surface, a second surface opposite to the first surface and a first lateral surface extending between the first surface and the second surface, the substrate having an antenna pattern adjacent to the second surface of the substrate; and
(b) forming a shielding layer on the first lateral surface of the substrate,
wherein a distance between the second surface of the substrate and a lower surface of the shielding layer is larger than a distance between the second surface of the substrate and an upper surface of the antenna pattern.

19. The method of claim 18, wherein operation (b) further comprises:
disposing a protection film on the second portion of the first lateral surface of the substrate;
forming the shielding layer on the first portion of the first lateral surface of the substrate and the protection film; and
removing the protection layer to expose the second portion of the first lateral surface of the substrate.

20. The method of claim 18, wherein operation (b) further comprises:
forming the shielding layer fully on the first lateral surface of the substrate; and
removing a portion of the shielding layer and a portion of the substrate,
wherein a thickness of the removed portion of the substrate is substantially equal to the distance between the second surface of the substrate and the upper surface of the antenna pattern.

* * * * *